(12) United States Patent
Yoshida

(10) Patent No.: US 8,084,358 B2
(45) Date of Patent: Dec. 27, 2011

(54) SEMICONDUCTOR DEVICE AND MANUFACTURING METHOD THEREOF

(75) Inventor: Hiroshi Yoshida, Toyama (JP)

(73) Assignee: Panasonic Corporation, Osaka (JP)

( * ) Notice: Subject to any disclaimer, the term of this patent is extended or adjusted under 35 U.S.C. 154(b) by 431 days.

(21) Appl. No.: 12/365,546

(22) Filed: Feb. 4, 2009

(65) Prior Publication Data

US 2009/0224363 A1 Sep. 10, 2009

(30) Foreign Application Priority Data

Mar. 10, 2008 (JP) ................ 2008-060040

(51) Int. Cl.
*H01L 21/4763* (2006.01)

(52) U.S. Cl. ........... 438/638; 257/E21.579; 257/295; 438/629; 438/396

(58) Field of Classification Search .......... 438/629, 438/637–639, 396; 257/E21.579, E21.259, 257/295, 306
See application file for complete search history.

(56) References Cited

U.S. PATENT DOCUMENTS

| | | | | |
|---|---|---|---|---|
| 6,207,583 B1 * | 3/2001 | Dunne et al. | .............. | 438/725 |
| 6,211,063 B1 * | 4/2001 | Liu et al. | .............. | 438/624 |
| 6,242,299 B1 * | 6/2001 | Hickert | .............. | 438/240 |
| 6,365,508 B1 * | 4/2002 | Zhou et al. | .............. | 438/627 |
| 2007/0123031 A1 | 5/2007 | Isogai | | |

FOREIGN PATENT DOCUMENTS

| | | |
|---|---|---|
| JP | 04-098832 | 3/1992 |
| JP | 04-125925 | 4/1992 |
| JP | 04-217319 | 8/1992 |
| JP | 2007-180311 | 7/2007 |

* cited by examiner

*Primary Examiner* — David Vu

(74) *Attorney, Agent, or Firm* — McDermott Will & Emery LLP

(57) ABSTRACT

In a manufacturing method of a semiconductor device, an insulating film is formed on a first conductive film. By using a mask film having an opening that exposes the insulating film, anisotropic etching is performed to form a recess is formed in an upper part of the insulating film exposed to the opening and to cause a reaction product to adhere to a lower part of a sidewall portion of the mask film. Isotropic etching is then performed to decrease the sidewall portion of the mask film in a horizontal direction, and anisotropic etching is performed to etch the insulating film exposed at a bottom of the recess in a vertical direction while removing the reaction product adhering to the lower part of the sidewall portion of the mask film. Anisotropic etching is then performed to etch the insulating film present around the recess in the vertical direction to form a stepped portion, and also to etch the insulating film exposed at the bottom of the recess to expose the first conductive film. A second conductive film is then formed on the first conductive film.

7 Claims, 6 Drawing Sheets

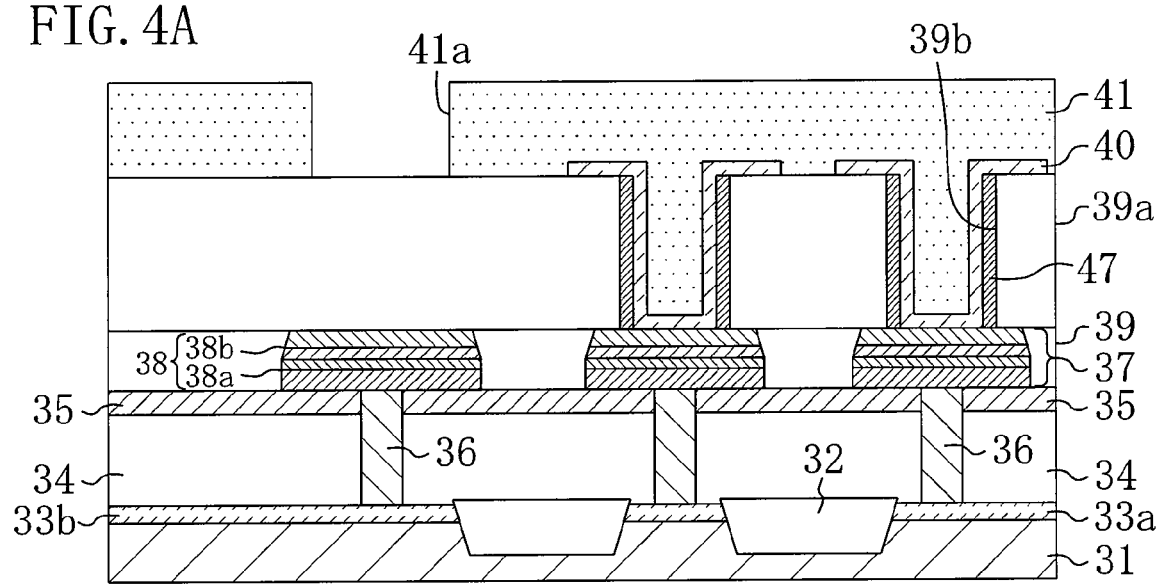
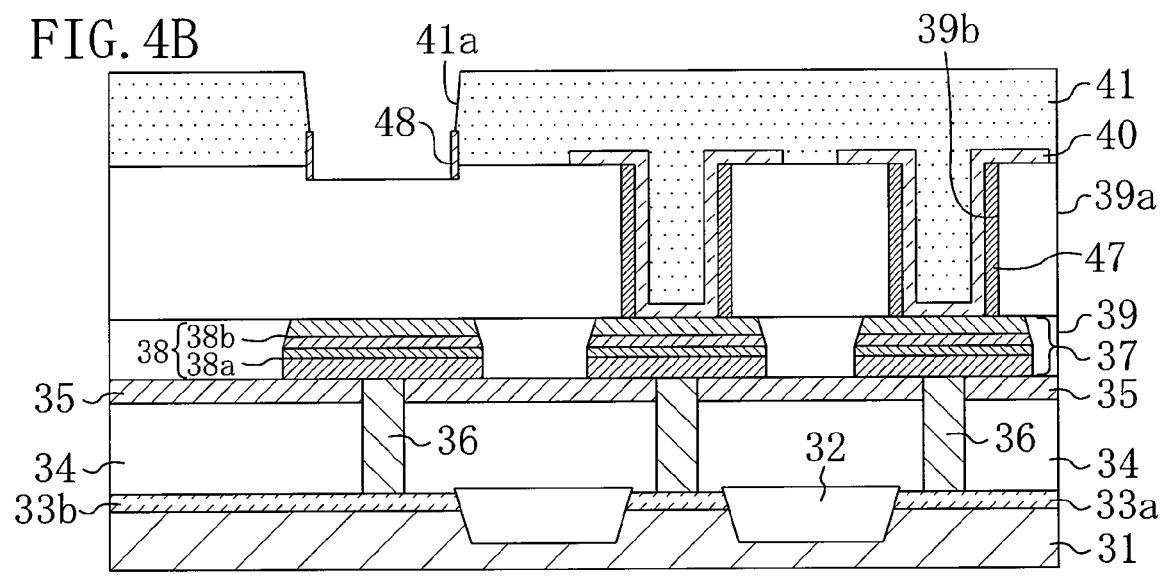
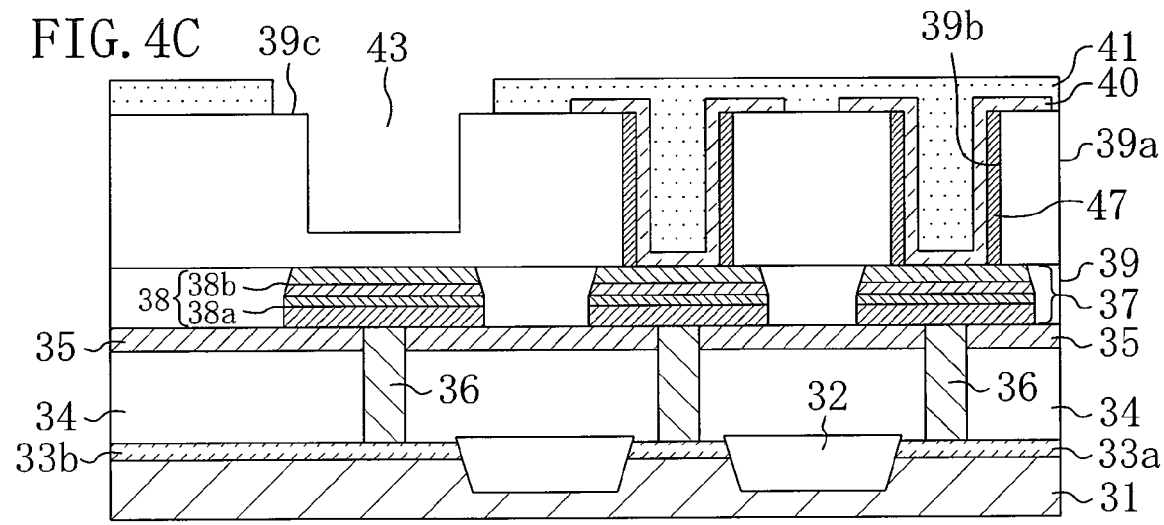

SEMICONDUCTOR DEVICE AND MANUFACTURING METHOD THEREOF

CROSS-REFERENCE TO RELATED APPLICATIONS

This application claims priority under 35 U.S.C. §119(a) on Japanese Patent Application No. 2008-060040 filed on Mar. 10, 2008, the entire contents of which are hereby incorporated by reference.

BACKGROUND OF THE INVENTION

1. Field of the Invention

An example embodiment of the present invention generally relates to a semiconductor device and a manufacturing method thereof. More particularly, an example embodiment of the present invention relates to a semiconductor device having a structure capable of preventing disconnections of a conductive film over contact holes.

2. Related Art

Memories generally include a DRAM (Dynamic Random Access Memory), an SRAM (Static Random Access Memory), a flash memory, a FeRAM (Ferroelectric Random Access Memory), and the like. The DRAM and the SRAM are characterized by losing its stored data when the power supply is turned off, while the FeRAM and the flash memory are characterized by not losing its stored data even if the power supply is turned off.

The FeRAM is a nonvolatile memory based on characteristics of a ferroelectric material, and uses a noble metal such as platinum (Pt) or iridium (Ir), or a ferroelectric material such as PZT ($Pb(Zr_{1-x}Ti_x)O_3$) or SBT ($SrBi_2Ta_2O_9$). Since it is difficult to process these materials, the FeRAM manufacturing process is complicated as compared to typical memory manufacturing processes such as LSI, DRAM, SRAM, and flash memory.

For example, the ferroelectric material is formed by using MOCVD (Metal Organic Chemical Vapor Deposition) or MOD (Metal Organic Decomposition). In order for ferroelectricity to develop, sintering in an oxygen atmosphere at about 700° C. to about 800° C. is required as a post-treatment. A material capable of retaining its conductivity even after oxidization, such as platinum, is therefore used as an electrode material of a ferromagnetic capacitor. However, platinum is a thermally shrinkable material and is therefore is susceptible to disconnections. Accordingly, it is important to form an underlying film of the platinum film in such a shape that prevents disconnections of the platinum film. Disconnections are likely to be generated especially when platinum is formed over a ferroelectric material having a hole pattern.

For example, Japanese Laid-Open Publication No. H04-125925 proposes a semiconductor device as a structure for preventing disconnections of a conductive film formed over a hole pattern.

FIGS. 6A through 6E are cross-sectional views of a main part sequentially illustrating a manufacturing method of the semiconductor device of the related art.

As shown in FIG. 6A, an interlayer insulating film 102 is first formed on a semiconductor substrate 101, and a resist pattern 103 having an opening in a predetermined region is formed on the interlayer insulating film 102.

As shown in FIG. 6B, by using the resist pattern 103 as a mask, a hole 104 having a predetermined depth is then formed in the interlayer insulating film 102 by anisotropic etching.

As shown in FIG. 6C, a deposition film (polymerization film) 105 is then formed over the whole surface of the semiconductor substrate 101 including the inside of the hole 104.

As shown in FIG. 6D, the deposition film 105 is then etched by anisotropic etching. The deposition film 105 thus remains only on the sidewall of the hole 104. A hole 106 is formed by continuing the anisotropic etching by using this remaining deposition film 105 as a mask. The hole 106 extends through the interlayer insulating film 102 at the bottom of the hole 104 and exposes the semiconductor substrate 101.

As shown in FIG. 6E, the deposition film 105 remaining in the hole 104 and the resist pattern 103 remaining on the top surface of the interlayer insulating film 102 are then removed by etching. As a result, holes 107 and 106 are formed in the interlayer insulating film 102. The hole 107 is located in the upper part of the interlayer insulating film 102 and has a wide opening diameter. The hole 106 communicates with the hole 107 and has a smaller opening diameter than that of the hole 107. A stepped shape is thus formed in a portion of the interlayer insulating film 102 which is exposed to the holes 106 and 107.

As has been described above, according to the manufacturing method of the semiconductor device of the related art, coverage of a conductive film over the hole pattern is improved by forming the stepped shape in the portion exposed to the hole pattern. Generation of disconnections is therefore suppressed.

SUMMARY OF THE INVENTION

However, it is difficult to pattern a ferroelectric material by dry etching. Therefore, when a hole pattern is formed in a ferroelectric material, processing defects such as fences, rabbit ears, or crowns are likely to be generated. In dry etching technology, a metal or $SiO_2$ is caused to react with a halogen element such as chlorine (Cl), fluorine (F), or bromine (Br) by using plasma under vacuum to produce a low melting-point compound (low vapor-pressure) compound. A pattern of a desired shape can be formed by vaporizing the low melting-point compound thus produced. Many of the elements of a ferroelectric material produce a less volatile compound by reaction with a halogen element. For example, while aluminum chloride ($AlCl_3$) has a melting point of 193° C., strontium chloride ($SrCl_2$), a chloride of strontium (Sr) contained in SBT, has a high melting point of 874° C. The reaction product therefore adheres to the sidewall of a resist pattern used as a patterning mask.

The composition of a reaction product varies depending on a material of a film to be etched and a material of an etching gas. For example, in the case of etching SBT with a chlorine-based gas, respective chlorides of strontium (Sr), bismuth (Bi), and tantalum (Ta) of SBT and strontium, bismuth, and tantalum themselves adhere to the sidewall of a resist pattern as a reaction product, resulting in fences. For example, in the case of etching SBT with a fluorine-based gas, on the other hand, respective fluorides of strontium, bismuth, and tantalum, and strontium, bismuth, and tantalum themselves adhere to the sidewall of a resist pattern as a reaction product, resulting in fences.

In the case where factors of physical sputter etching are dominant, a film to be etched is sputtered and adheres to the sidewall of a resist pattern as a reaction product. The nonvolatile reaction product thus adhering to the sidewall of the resist pattern remains after removal of the resist pattern, resulting in defective patterns such as fences, rabbit ears, or crowns.

Especially in dry etching of contact holes, fences are likely to be generated because a photoresist mask pattern has small openings.

As described above, when a hole pattern is formed in a ferroelectric material, a reaction product is likely to adhere to the sidewall of a resist pattern, producing fences. As a result, a conductive film formed over the ferroelectric material having the hole pattern is susceptible to disconnections.

Even when a hole pattern is formed in various insulating films such as a silicon oxide film other than the ferroelectric material, fences are likely to be formed on the sidewall of a resist pattern if physical etching such as argon (Ar) sputtering is used. Accordingly, a conductive film is susceptible to disconnections.

In the manufacturing method of the semiconductor device of the related art, there is no disclosure about suppression of disconnections in the case of forming a hole pattern in a ferroelectric material and about suppression of disconnections in the case where fences can be formed on the sidewall of a resist pattern.

In view of the above problems, it is an object of the present invention to provide a semiconductor device having a structure capable of preventing disconnections of a conductive film formed over a hole pattern of an insulating film, and a manufacturing method thereof.

A method for manufacturing a semiconductor device according to an example aspect of the present invention includes the steps of: (a) forming a first conductive film on a substrate; (b) forming an insulating film on the first conductive film; (c) forming on the insulating film a mask film having an opening exposing the insulating film; (d) anisotropically etching the insulating film exposed to the opening to form a recess in an upper part of the insulating film exposed in the opening and to cause a reaction product of a material of the insulating film and a material of an etching gas used for the anisotropic etching to adhere to a lower part of a sidewall portion of the mask film in the opening; (e) performing isotropic etching by using the reaction product as a mask to decrease the sidewall portion of the mask film in the opening in a horizontal direction to a main surface of the substrate, and performing anisotropic etching to etch the insulating film exposed at a bottom of the recess in a vertical direction to the main surface of the substrate while removing the reaction product adhering to the lower part of the sidewall portion of the mask film in the opening; (f) after the step (e), performing anisotropic etching by using the remaining mask film as a mask, thereby etching the insulating film present around the recess in the vertical direction to the main surface of the substrate to form a stepped portion in the insulating film, and also etching the insulating film exposed at the bottom of the recess to expose the first conductive film; and (g) after removing the remaining mask film, forming a second conductive film on the first conductive film exposed to the recess and on the insulating film.

In the method according to an example aspect of the present invention, a distance from an upper surface of the insulating film to a lower surface of the insulating film which forms the stepped portion is equal to a thickness of the second conductive film.

In the method according to an example aspect of the present invention, the steps (d), (e), and (f) are continuously performed under same etching conditions.

In the method according to an example aspect of the present invention, the etching conditions are such that an etching gas is an $Ar/CF_4$ or $Ar/Cl_2$ mixed gas, and an etching pressure in a chamber is controlled to 1.0 Pa to 2.0 Pa, and a bias of applied etching power is controlled to 150 W to 300 W.

In the method according to an example aspect of the present invention, the first conductive film and the second conductive film are made of a metal selected from a metal group consisting of platinum, iridium, and ruthenium, or a compound of a metal selected from the metal group.

In the method according to an example aspect of the present invention, the insulating film contains a ferroelectric material.

In the method according to an example aspect of the present invention, the ferroelectric material is SBT or PZT.

A semiconductor device according to an example aspect of the present invention includes: a first conductor film formed on a substrate; an insulating film formed on the first conductor film and having an opening exposing the first conductive film; and a second conductive film formed on the first conductive film exposed to the opening and on the insulating film. The insulating film has a stepped portion so that the opening is formed by a first recess exposing the first conductive film and a second recess communicating with the first recess and having a larger opening diameter than that of the first recess.

In the semiconductor device according to an example aspect of the present invention, the first conductive film and the second conductive film are made of a metal selected from a metal group consisting of platinum, iridium, and ruthenium, or a compound of a metal selected from the metal group.

In the semiconductor device according to an example aspect of the present invention, the insulating film contains a ferroelectric material.

In the semiconductor device according to an example aspect of the present invention, the ferroelectric material is SBT or PZT.

As has been described above, according to the semiconductor device and the manufacturing method thereof according to an example aspect of the present invention, a conductive film formed in contact holes can be prevented from being disconnected in a semiconductor manufacturing process. Moreover, variation in processing dimensions can be reduced, whereby high yield can be obtained.

BRIEF DESCRIPTION OF THE DRAWINGS

FIGS. 4A, 4B, and 4C are cross-sectional views of a main part sequentially illustrating a manufacturing method of a semiconductor device according to a third example embodiment of the present invention;

DETAILED DESCRIPTION OF THE PREFERRED EMBODIMENTS

Hereinafter, example embodiments of the present invention will be described with reference to the accompanying drawings. Note that the present invention provides a semiconductor device having a structure capable of preventing disconnections of a conductive film formed over a hole pattern of an insulting film and a manufacturing method thereof. In the following example embodiments, description is given to the case where a conductive film is formed over a hole pattern of a ferroelectric material and the case where a conductive film is formed over a hole pattern of an insulating film such as a silicon oxide film. However, the present invention is not limited to these example embodiments and is applicable to various forms which embody the technical idea of the present invention.

First Embodiment

Hereinafter, a semiconductor device and a manufacturing method thereof according to a first example embodiment of the present invention will be described.

FIGS. 1A through 1G are cross-sectional views sequentially showing the manufacturing method of the semiconductor device according to the first example embodiment of the present invention.

Figure 1A:
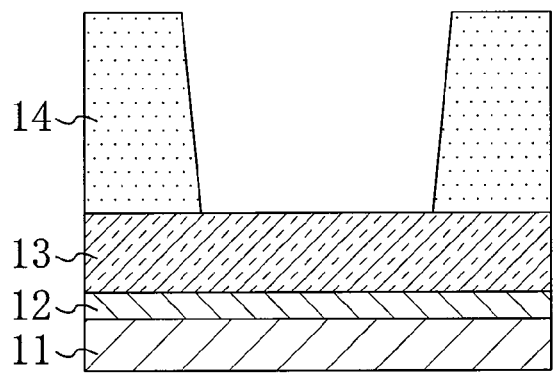
FIGS. 1A, 1B, 1C, 1D, 1E, 1F, and 1G are cross-sectional views of a main part sequentially illustrating a manufacturing method of a semiconductor device according to a first example embodiment of the present invention.

First, as shown in FIG. 1A, a conductive film 12 of, for example, platinum (Pt) is formed with a thickness of 100 nm on a semiconductor substrate 11. A ferroelectric film 13 of, for example, SBT is then formed with a thickness of 200 nm on the conductive film 12. A resist mask pattern 14 is then formed on the ferroelectric film 13. The resist pattern mask 14 has an opening in a predetermined region by photolithography.

Figure 1E:
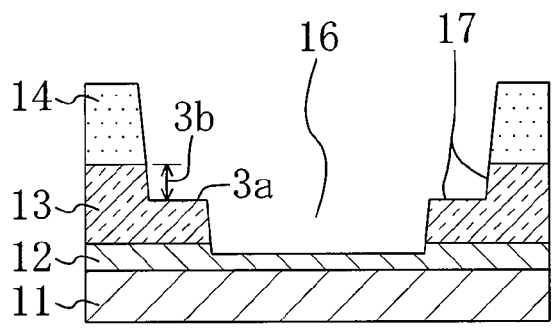
Figure 1B:
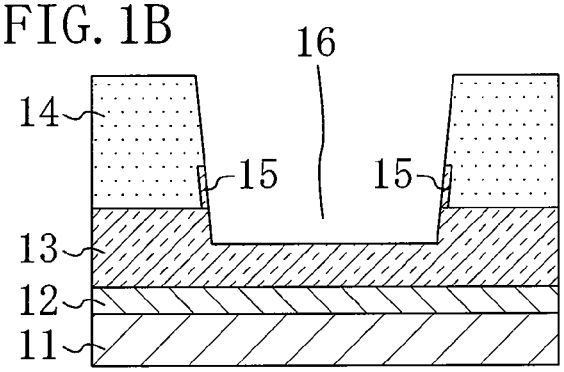

As shown in FIG. 1B, anisotropic etching is then performed by using the resist mask pattern 14 as a mask. More specifically, by using the resist mask pattern 14 as a mask, the ferroelectric film 13 is dry etched with an argon/carbon-fluoride (Ar/$CF_4$) mixed gas. This dry etching is performed with a bias of applied etching power controlled to 200 W to 300 W and in an atmosphere having an etching pressure in a chamber controlled to about 1.0 Pa to about 2.0 Pa. The ferroelectric film 13 is thus etched away to a predetermined depth to form a recess 16. During this etching of the ferroelectric film 13, a reaction product is generated by a ferroelectric material of the ferroelectric film 13 and a material of the etching gas. This reaction product is deposited as a resist sidewall protective film 15 on a lower sidewall portion of the resist mask pattern 14. The resist sidewall protective film 15 has a height of 100 nm to 200 nm.

Figure 1F:
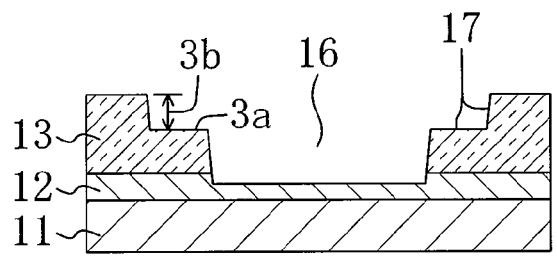
Figure 1C:
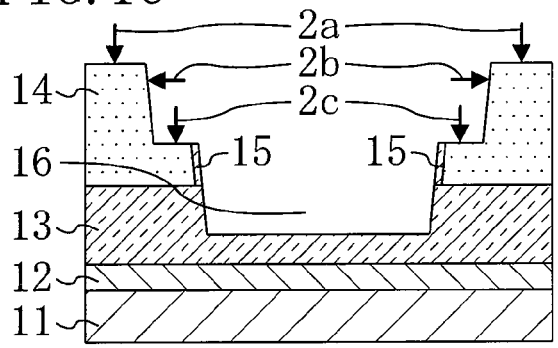

Isotropic etching and anisotropic etching are then performed as shown in FIG. 1C. More specifically, a portion of the ferroelectric film 13 which is exposed to the bottom of the recess 16 is removed by anisotropic etching while decreasing the sidewall of the resist pattern 14 in a direction horizontal to the main surface of the semiconductor substrate 11 (hereinafter, simply referred to as "horizontal direction") by isotropic etching. The bottom of the recess 16 is thus etched in a direction vertical to the main surface of the semiconductor substrate 11 (hereinafter, simply referred to as "vertical direction"). The dry etching conditions herein need to be determined so that the resist mask pattern 14 decreases in the horizontal direction. For example, the dry etching is performed at a high temperature with addition of a small amount of oxygen.

Since the resist sidewall protective film 15 is formed on the lower sidewall portion of the resist mask pattern 14, the lower sidewall portion of the resist mask pattern does not decrease in the horizontal direction. This is because etching 2b in the horizontal direction is caused by a chemical reaction and the resist sidewall protective film 15 is made of a reaction product that cannot be removed by a chemical reaction. However, since etching 2c in the vertical direction progresses simultaneously in the resist mask pattern 14, the height of the resist sidewall protective film 15 decreases as the etching progresses. This is because the etching 2c in the vertical direction in the resist mask pattern 14 progresses by a physical etching action caused by ion collision. The resist mask pattern 14 generally decreases in the vertical direction by etching 2a in the vertical direction and the etching 2c in the vertical direction in the resist mask pattern 14.

The amount by which the resist mask pattern 14 decreases per unit time (resist etching rate) and the amount by which the ferroelectric film 13, a film to be etched, is etched per unit time (ferroelectric film etching rate) can be controlled by etching conditions. The etching rate ratio of the ferroelectric film 13 to the resist mask pattern 14 (hereinafter, referred to as etching selectivity) can thus be varied. Especially an etching device using ICP (Inductively Coupled Plasma) as a plasma source and capable of independently applying a bias to a lower electrode can control the resist etching rate by ICP output and can control the ferroelectric film etching rate by bias output. For example, increasing the ICP output facilitates etching caused by a chemical reaction. Accordingly, in the case where a film to be etched is made of a material that is less likely to be etched such as a ferroelectric material, the resist etching rate becomes higher than the ferroelectric material etching rate. The etching selectivity is therefore decreased. On the other hand, increasing the bias output increases sputtering components in the etching. In this case, the ferroelectric film etching rate becomes higher than the resist etching rate. The etching selectivity is therefore increased.

Figure 1G:
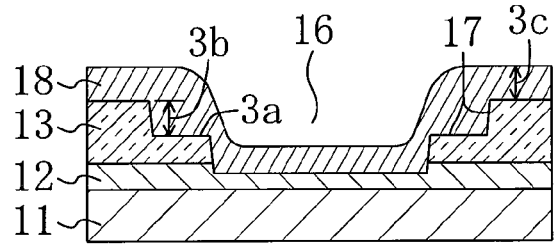
Figure 1D:
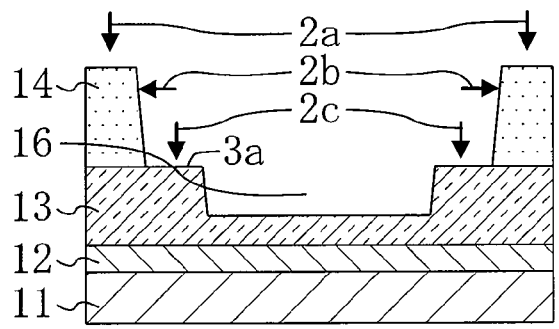

As shown in FIG. 1D, as the isotropic etching and the anisotropic etching are further continued under the etching conditions described above with reference to FIG. 1C, the surface of the ferroelectric film 13 is exposed in an outer periphery 3a of the recess 16 by the etching 2c in the vertical direction in the resist mask pattern 14. At this time, the resist sidewall protective film 15 is also removed by the etching 2c. Moreover, a portion of the ferroelectric film 13 which is exposed to the bottom of the recess 16 is removed, whereby the bottom of the recess 16 is further etched in the vertical direction.

As shown in FIG. 1E, as the isotropic etching and the anisotropic etching are further continued under the same etching conditions, the depth of the recess 16 of the ferroelectric film 13 is further increased, and the recess 16 eventually extends through the ferroelectric film 13 and exposes the conductive film 12. The exposed portion of the ferroelectric film 13 in the outer periphery 3a of the recess 16 is also etched, whereby a stepped portion 17 is formed in the outer periphery 3a of the recess 16. More specifically, a recess having a larger opening diameter than that of the recess 16 communicates with the recess 16, thereby forming the stepped portion 17. A hole pattern is thus formed in the ferroelectric film 13.

In order to obtain excellent coverage of a conductive film 18 formed in a later step, it is preferable to etch the ferroelectric film 13 of 200 nm thickness so that the upper part of the stepped portion 17 finally has a depth 3b of about 100 nm (about a half of the film thickness). In order to implement this, the height of the exposed surface of the ferroelectric film 13 in the outer periphery 3a of the recess 16 needs to be 100 nm or more from the bottom in the middle of the recess 16 at the time when the surface of the ferroelectric film 13 is exposed in the outer periphery 3a of the recess 16 (the step of FIG. 1D). It is herein assumed that this surface height of the ferroelectric film 13 is less than 100 nm at the time the surface of the ferroelectric film 13 is exposed in the outer periphery 13a of the recess 16. In this case, when the ferroelectric film 13 is completely etched away in the middle of the recess 16 (the film thickness of 200 nm is finally etched away), that is, when the recess 16 extends through the ferroelectric film 13 in the middle and exposes the top surface of the conductive film 12, the upper part of the stepped portion 17 has a depth 3b of more than 100 nm in the outer periphery 3a of the recess 16, and the ferroelectric film has a thickness difference of less than 100 nm between the middle of the recess 16 and the outer periphery 3a thereof.

On the other hand, even if this surface height of the ferroelectric film 13 from the bottom in the middle of the recess 16 exceeds 100 nm at the time the surface of the ferroelectric film 13 is exposed in the outer periphery 3a of the recess 16, the depth of the upper part of the stepped portion 17 in the outer periphery 3a of the recess 16 can be adjusted to 100 nm by adjusting the over-etching time after the underlying conductive film 12 is exposed in the middle of the recess 16.

As shown in FIG. 1F, the resist pattern 14 is then removed, whereby the ferroelectric film 13 having the stepped portion 17 in the outer periphery 3a of the recess 16 can be obtained.

As shown in FIG. 1G, a conductive film 18 is then formed on the ferroelectric film 13 having the stepped portion 17, including the inside of the recess 16. Since the outer periphery 3a of the recess 16 has a stepped shape, the conductive film 18 in this portion does not become thin and thus has excellent coverage. The conductive film 12 and the conductive film 18 are therefore stably electrically connected to each other. Note that the conductive film 18 can be made of a metal selected from the metal group consisting of platinum, iridium, and ruthenium, or a compound of a metal selected from this metal group. Similarly, the conductive film 12 can be made of a metal selected from the above metal group or a compound of a metal selected from the metal group.

The area of the portion exposed to the bottom of the recess 16 is determined by the resist sidewall protective film 15 formed in the early stage of the etching. Variation in contact area with the conductive film 12 is therefore suppressed, whereby variation in contact resistance can be suppressed.

It is desirable that a thickness 3c of the conductive film 18 is equal to the depth 3b of the upper part of the stepped portion 17. In other words, in the case where the upper part of the stepped portion 17 has a depth 3b of 100 nm, it is desirable that the conductive film 18 has a thickness of 100 nm. The reason for this will now be described with reference to FIGS. 2A and 2B.

Figure 2A:
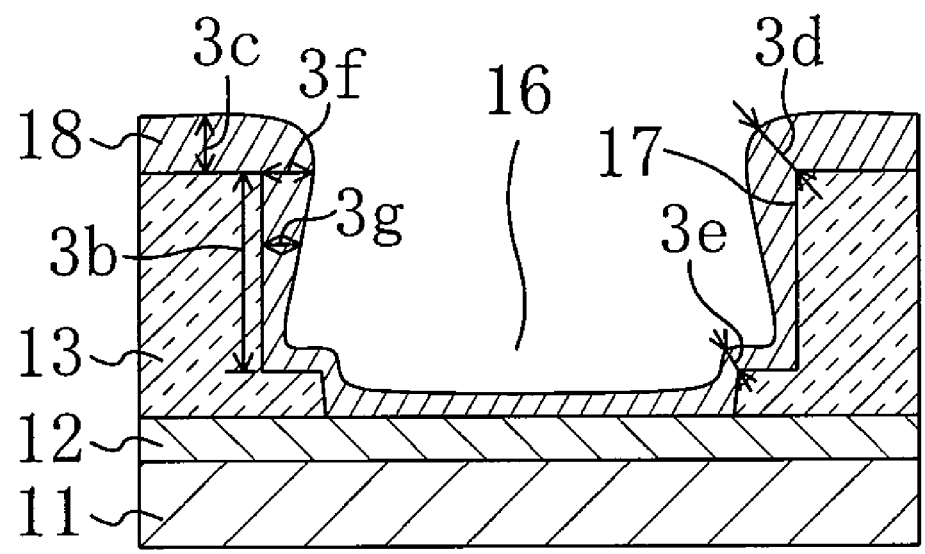
FIGS. 2A and 2B are cross-sectional views of a main part illustrating the shape of a stepped portion in the semiconductor device according to the first example embodiment of the present invention.
Figure 2B:
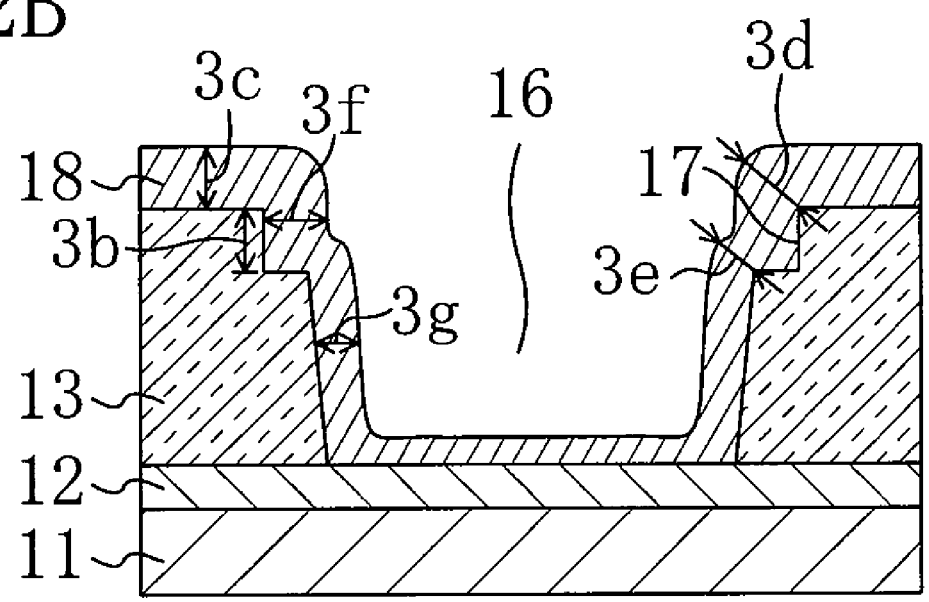

FIGS. 2A and 2B are cross-sectional views illustrating the depth of the upper part of the stepped portion 17 in the semiconductor device according to the first example embodiment of the present invention.

FIG. 2A shows the case where the thickness 3c of the conductive film 18 in the flat portion of the upper part of the recess 16 is smaller than the depth 3b of the stepped portion 17. It is herein assumed that the thickness 3c of the conductive film 18 is approximately equal to the depth 3b of the stepped portion 17.

In general, a thickness 3g of the conductive film 18 on the sidewall portion of the recess 16 is thinner than the thickness 3c of the conductive film 18. This phenomenon is significant especially when the film is formed by sputtering. In a typical sputtering device, the thickness of the conductive film 18 in the bottom of the recess 16 also becomes thinner than the thickness 3c of the conductive film 18 due to the low directivity of sputtering particles. The conductive film 18 has an overhang shape in the recess 16. On the contrary, as the directivity of sputtering particles is closer to random, a thickness 3f of the conductive film 18 at the upper corner of the ferroelectric film 13 in the recess 16 becomes equal to the thickness 3c of the conductive film 18.

In the case of FIG. 2A, a region around the lower corner of the ferroelectric film 13 in the recess 16 is blocked by the conductive film 18 formed on the upper corner of the ferroelectric film 13 of the recess 16. As a result, the thickness 3e of the conductive film 18 in the region around the lower corner of the ferroelectric film 13 in the recess 16 becomes thinner than the thickness 3d of the conductive film 18 in the upper corner of the ferroelectric film 13 in the recess 16. The conductive film 18 is therefore more susceptible to disconnections.

In the case of FIG. 2B, however, the thickness 3c of the conductive film 18 is almost the same as the thickness 3e of the conductive film 18 on the lower corner of the ferroelectric film 13 in the recess 16. The overhang shape as shown in FIG. 2A is less likely to be formed. In FIG. 2B, an overhang shape is formed around the lower corner of the ferroelectric film 13 in the recess 16. However, a region that is blocked by the thickness on the lower corner of the ferroelectric film 13 is reduced on the bottom of the recess 16 as compared to FIG. 2A. As a result, the conductive film 18 has smooth coverage in the region including the stepped portion 17, and is therefore less susceptible to disconnections.

Hereinafter, the dry etching conditions in FIGS. 1B through 1E will be described in detail.

The steps of FIGS. 1B through 1E may be performed by using independent, different etching conditions. By optimizing the etching conditions, however, the steps of FIGS. 1B through 1E can be performed without changing main etching conditions. In other words, the steps of FIGS. 1B through 1E can be performed by, for example, merely adjusting etching parameters for each step. Hereinafter, the optimized etching conditions will be described.

Dry etching is roughly divided into two types: isotropic etching and anisotropic etching. In the isotropic etching, an exposed surface is etched by chemical reaction. In the anisotropic etching, on the other hand, an etching species ionized by an electric field travels in a fixed direction, and a surface vertical to the traveling direction of the ionized etching species is etched. In the anisotropic etching, in the step of FIG. 1C, the etching 2a in the vertical direction therefore becomes dominant in the top part of the resist mask pattern 14, whereas the etching 2c in the vertical direction becomes dominant in the inner side of the resist mask pattern 14.

The etching of the present invention requires the etching 2b of the resist mask pattern 14 in the horizontal direction in the step of FIG. 1C. In other words, the conditions for the isotropic etching are required for the resist mask pattern 14. Moreover, the recess 16 formed in the ferroelectric film 13 needs to be anisotropically etched in order to suppress variation in dimensions. In other words, the etching conditions need to be determined so that the resist mask pattern 14 is isotropically etched and the ferroelectric film 13 is anisotropically etched.

The resist mask pattern 14 is made of an organic material. By performing etching in an oxygen atmosphere, the resist mask pattern 14 chemically reacts with oxygen and thus can be isotropically etched. Moreover, it is generally known in the art that increasing a higher etching pressure increases chemically reactive components in the etching and thus increases the amount of decrease of the resist mask pattern 14 per unit time (resist etching rate). In the case of a dry etching facility using ICP as a plasma source, increasing the IP power increases chemically reactive components in the etching and thus increases the amount of decrease of the resist mask pattern 14 per unit time (resist etching rate).

Etching of the ferroelectric film 13, on the other hand, often uses a fluorine-based or chlorine-based gas. However, main elements of a ferroelectric material produce a high melting-point and therefore less volatile reaction product by chemical reaction with an etching species such as fluorine and chlorine. The reaction product therefore remains on a substrate surface. The ferroelectric material is therefore commonly etched by adding sputtering components and thus adding the energy for separation from the substrate surface. By bias application, the sputtering components cause the etching species to have directivity, and therefore the resultant etching action has an anisotropic property. On the contrary, since it is difficult to chemically etch the ferroelectric film 13, it is difficult to isotropically etch the ferroelectric film 13. Moreover, sputtering components in the etching can be increased by adding argon (Ar) to the etching gas.

Desirable etching gases for the ferroelectric film 13 are $CF_4$ as a fluorine-based gas and $Cl_2$ as a chlorine-based gas. Other fluorine-based gases such as $CHF_3$ and $C_4F_8$ are used primarily in dry etching. However, these gases form a polymer during etching, and this polymer is deposited on the sidewall of the resist pattern 14 to form an etching protective film. The amount of decrease of the resist mask pattern 14 per unit time is therefore reduced. On the other hand, since $CF_4$ is less likely to form a polymer, the resist mask pattern 14 is likely to be decreased. For both $CF_4$ and $Cl_2$, the more the gas is added, the more the amount of resist decrease tends to increase.

As has been described above, by adding $O_2$ to an $Ar/CF_4$ or $Ar/Cl_2$ mixed gas for use in the dry etching of the present invention, the resist mask pattern 14 is isotropically etched by the chemical reaction with $O_2$, while the ferroelectric film 13 is anisotropically etched by the sputtering property. As a result, the ferroelectric film 13 can be etched in the vertical direction while decreasing the resist mask pattern 14 in the horizontal direction. The series of steps in FIGS. 1B through 1E can thus be performed under the same dry etching conditions.

In view of the above description, in the first example embodiment of the present invention, a small amount of oxygen was added to an $Ar/CF_4$ or $Ar/Cl_2$ mixed gas and etching was performed by using the resultant gas. Adding oxygen increases the amount of resist decrease in the horizontal direction. Moreover, in the case of using a CF-based gas, adding oxygen causes bonding of oxygen with carbon generated during etching. Since this bonding of oxygen with carbon hinders polymer formation, a protective film is less likely to be formed on the sidewall of the resist mask pattern 14.

In the case of using an etching device using ICP as a plasma source, the following etching conditions are desirable: the $Ar/CF_4$ or $Ar/Cl_2$ ratio is 1/1 or less (e.g., Ar: $30 \times 10^{-3}$ ml/min and $CF_4$: $20 \times 10^{-3}$ ml/min); and the pressure is about 1.0 Pa to about 2.0 Pa. Moreover, oxygen is desirably added by about 10% of the total flow rate (e.g., Ar: $30 \times 10^{-3}$ ml/min, $CF_4$: $20 \times 10^{-3}$ ml/min, and $O_2$: $5 \times 10^{-3}$ ml/min). Adding too much oxygen increases the amount of resist decrease in the horizontal direction per unit time, and therefore the resist mask pattern 14 may be eliminated during etching.

By adjusting the bias output of the etching conditions, the reaction product that adheres to the lower sidewall of the resist mask pattern 14 can be controlled in the step of FIG. 1B. The bias output increases sputtering components in the etching. As a result, a less volatile reaction product adheres to the lower sidewall of the resist mask pattern 14. Note that, as described above, in the case of etching SBT with a chlorine-based gas, for example, respective chlorides of strontium (Sr), bismuth (Bi), and tantalum (Ta) and strontium, bismuth, and tantalum themselves are deposited as a reaction product on the lower sidewall of the resist mask pattern 14 in the step of FIG. 1B. In the case of etching SBT with a fluorine-based gas, on the other hand, respective fluorides of strontium, bismuth, and tantalum, and strontium, bismuth, and tantalum themselves are deposited as a reaction product on the lower sidewall of the resist mask pattern in the step of FIG. 1B.

In the etching conditions of the first example embodiment of the present invention, the sidewall of the resist mask pattern 14 decreases in the horizontal direction during etching. A less volatile reaction product therefore adheres to the sidewall of the resist mask pattern 14 only in the early stage of the etching because the amount of decrease of the resist mask pattern 14 is small during this period. As the sidewall of the resist mask pattern 14 decreases, the sidewall of the resist mask pattern 14 is tapered. As a result, the reaction product adhering to the tapered portion is continuously removed by the sputtering components of the etching.

Description has been given to the method for manufacturing a ferroelectric memory by forming the recess 16 in the ferroelectric film 13 by etching. However, a film to be etched is not limited to a ferroelectric film. The present invention can be carried out in the same manner as that described above even when a recess is formed in a material that is less likely to be dry etched, that is, a material that forms a less volatile reaction product by dry etching. The present invention is also applicable to the case where a recess is formed in an insulating film such as a silicon oxide film.

Second Embodiment

Hereinafter, a semiconductor device and a manufacturing method thereof according to a second example embodiment of the present invention will be described.

In the second example embodiment of the present invention, the manufacturing method of the semiconductor device according to the first example embodiment is applied to, for example, a manufacturing method of a ferroelectric memory.

FIGS. 3A through 3D are cross-sectional views sequentially illustrating the manufacturing method of the semiconductor device according to the second example embodiment of the present invention.

Figure 3A:
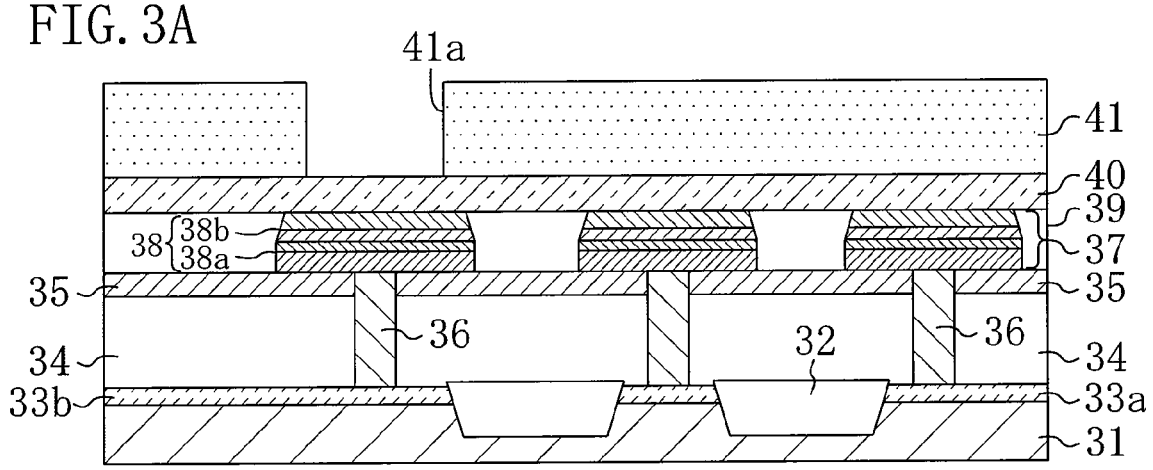
FIGS. 3A, 3B, 3C, and 3D are cross-sectional views of a main part sequentially illustrating a manufacturing method of a semiconductor device according to a second example embodiment of the present invention.

First, as shown in FIG. 3A, an element isolation region 32 defining element formation regions is first formed in a semiconductor substrate 31. Activation regions 33a and 33b are then formed in the regions of the semiconductor substrate 31 defined by the element isolation region 32. Thereafter, an interlayer insulating film 34 is formed over the whole surface of the semiconductor substrate 31 and a hydrogen barrier film 35 is formed on the interlayer insulating film 34. Lower plugs 36 are then formed so as to extend through the hydrogen barrier film 35 and the interlayer insulating film 34. Each lower plug 36 is connected to a corresponding one of the activation regions 33a and 33b. A lower electrode 37 and an upper plug 38 are then formed on the hydrogen barrier film 35 so as to be surrounded by the interlayer insulating film 39. The lower electrode 37 is connected to a corresponding one of the lower plugs 36, and the upper plug 38 is connected to a corresponding one of the lower plugs 36 and draws the potential of an upper electrode described below in a downward direction. The upper plug 38 and the lower electrode 37 have the same film structure. More specifically, the upper plug 38 and the lower electrode 37 are made of a layered film of a conductive hydrogen barrier film 38a and an oxygen barrier film 38b. The conductive hydrogen barrier film 38a is made of a layered film of a Ti-based material, and the oxygen barrier film 38b is made of a layered film of a Pt-based or Ir-based material. The respective top surfaces of the interlayer insulating film 39, the lower electrode 37, and the upper plug 38 are then planarized and a ferroelectric film 40 is formed. A resist pattern 41 having an opening 41a right above the upper plug 38 is then formed on the ferroelectric film 40.

Figure 3B:
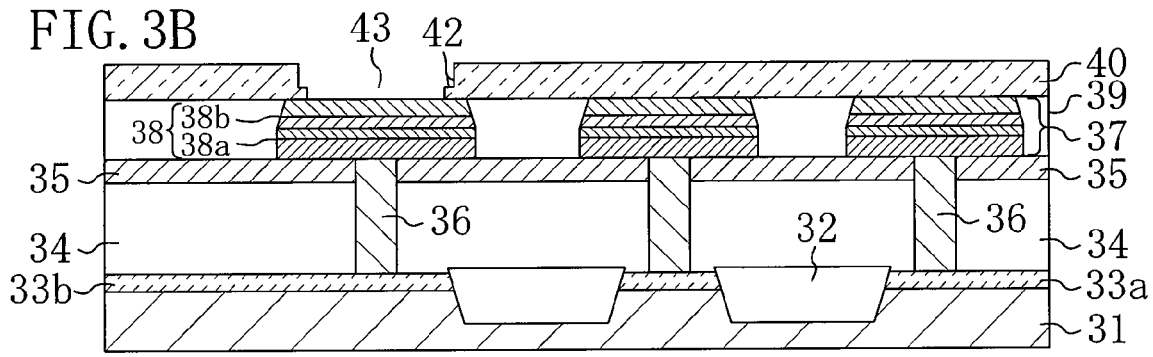

As shown in FIG. 3B, etching is performed using the resist mask pattern 41, whereby an opening 43 exposing the upper plug 38 is formed in the ferroelectric film 40 on the upper plug 38. This etching is performed under the conditions described in the first example embodiment. As a result, a stepped portion 42 is formed in the same manner as shown in FIG. 1F.

Figure 3C:
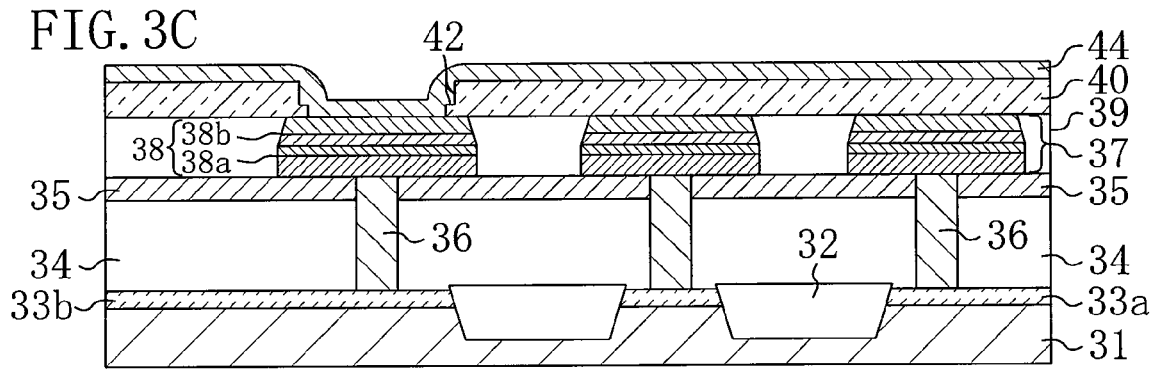

As shown in FIG. 3C, a conductive film (upper electrode) 44 is then formed on the ferroelectric film 40 including the inside of the opening 43 having the stepped portion 42. At this time, excellent coverage of the conductive film 44 is implemented in the inside of the opening 43 because step coverage is reduced by the stepped portion 42. As a result, disconnections of the conductive film (upper electrode) 44 can be prevented from occurring due to thermal shrinkage in a later step. Note that the conductive film 44 can be made of a metal selected from the metal group consisting of platinum, iridium, and ruthenium, or a compound of a metal selected from this metal group.

Figure 3D:
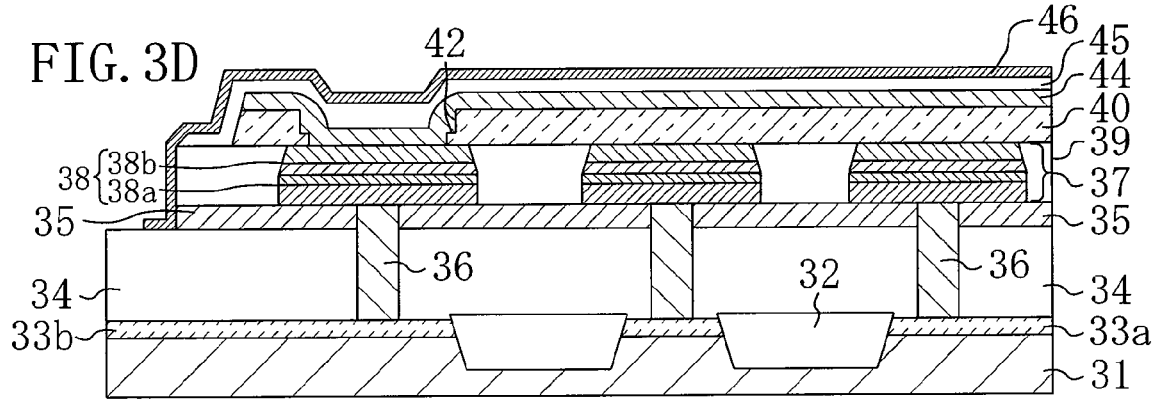

As shown in FIG. 3D, respective ends of the ferroelectric film 40 and the conductive film 44 are removed by etching to partially expose the interlayer insulating film 39. An interlayer insulating film 45 is then formed over the whole surface of the semiconductor substrate 31. After respective ends of the interlayer insulating film 45, the interlayer insulating film 39, and the hydrogen barrier film 35 are removed by etching, a hydrogen barrier film 46 is formed over the whole surface of the semiconductor substrate 31. The hydrogen barrier film 46 thus formed entirely covers a capacitor array of a plurality of ferroelectric capacitors made of the lower electrode 37, the ferroelectric film 40, and the conductive film (upper electrode) 44, and is connected to the hydrogen barrier film 35 in its peripheral edge. The structure in which the capacitor array is completely covered by the hydrogen barrier film is thus implemented.

The conductive film (upper electrode) 44 is electrically connected to the activation region 33b through the upper plug 38. As described above, the upper plug 38 has a layered structure of the conductive hydrogen barrier film 38a and the oxygen barrier film 38b sequentially formed in this order. The conductive film (upper electrode) 44 is connected to the activation region 33b with the capacitor array completely covered by the hydrogen barrier film 46. The activation region 33b is further electrically connected to an upper wiring layer so that the potential applied to the conductive film (upper electrode) 44 can be transmitted to the outside.

Third Embodiment

Hereinafter, a semiconductor device and a manufacturing method thereof according to a third example embodiment of the present invention will be described.

In the third example embodiment of the present invention, the manufacturing method of the semiconductor device according to the first example embodiment is applied to, for example, form a conductive film over a hole pattern formed in an insulating film such as a silicon oxide film in a manufacturing method of a ferroelectric memory.

FIGS. 4A through 4C and FIGS. 5A and 5B are cross-sectional views sequentially illustrating the manufacturing method of the semiconductor device according to the third example embodiment of the present invention.

First, as shown in FIG. 4A, an element isolation region 32 defining element formation regions is first formed in a semiconductor substrate 31. Activation regions 33a and 33b are then formed in the regions of the semiconductor substrate 31 defined by the element isolation region 32. Thereafter, an interlayer insulating film 34 is formed over the whole surface of the semiconductor substrate 31 and a hydrogen barrier film 35 is formed on the interlayer insulating film 34. Lower plugs 36 are then formed so as to extend through the hydrogen barrier film 35 and the interlayer insulating film 34. Each lower plug 36 is connected to a corresponding one of the activation regions 33a and 33b. A lower electrode 37 and an upper plug 38 are then formed on the hydrogen barrier film 35 so as to be surrounded by the interlayer insulating film 39 made of a silicon oxide film. The lower electrode 37 is connected to a corresponding one of the lower plugs 36, and the upper plug 38 is connected to a corresponding one of the lower plugs 36 and draws the potential of an upper electrode described below in a downward direction. Note that the upper plug 38 and the lower electrode 37 have the same film structure. More specifically, the upper plug 38 and the lower electrode 37 are made of a layered film of a conductive hydrogen barrier film 38a and an oxygen barrier film 38b. The conductive hydrogen barrier film 38a is made of a layered film of a Ti-based material, and the oxygen barrier film 38b is made of a layered film of a Pt-based or Ir-based material. The respective top surfaces of the interlayer insulating film 39, the lower electrode 37, and the upper plug 38 are then planarized and an interlayer insulating film 39a made of a silicon oxide film is formed. An opening 39b reaching the lower electrode 37 is then formed by photolithography and etching technologies in the interlayer insulating film 39a. A standing electrode 47 is then formed on the sidewall of the opening (capacitor formation hole) 39b, and a ferroelectric film 40 is formed on the interlayer insulting film 39a, the bottom of the opening 39b, and the standing electrode 47. Note that the ferroelectric film 40 on the upper plug 38 is removed, and the standing electrode 47 is made of the same material as that of the lower electrode 37, the upper plug 38, and an upper electrode 44 described below. Thereafter, a resist pattern 41 having an opening 41a above the upper plug 38 is formed on the ferroelectric film 40 including the inside of the opening 39b and on the interlayer insulating film 39a.

As shown in FIG. 4B, the interlayer insulating film 39a is then etched by using the resist mask pattern 41. By performing sputter etching using only an inert gas made of, for example, an Ar gas, the silicon oxide film of the interlayer insulating film 39a adheres to the sidewall of the resist mask pattern 41 (the sidewall of the opening 41a). A resist sidewall protective film 48 can thus be formed.

As shown in FIG. 4C, by using the resist sidewall protective film 48 as a mask, the interlayer insulating film 39a is further etched to form an opening 43 in the interlayer insulating film 39a. This etching is herein performed by using a CF-based gas. The amount of decrease of the sidewall of the resist mask pattern 41 can be adjusted by an oxygen flow rate added for etching. If the depth of the opening 43 to be formed in the interlayer insulating film 39a is larger than the thickness of the resist mask pattern 41, it is desirable to first etch the interlayer insulating film 39a to a desired depth under such etching conditions of the silicon oxide film that hardly affect the resist mask pattern 41, and then to change the etching conditions so that the sidewall of the resist mask pattern 41 is decreased. By performing the etching of the interlayer insulating film 39a as such, the opening 43 is formed in the interlayer insulating film 39a and a top surface 39c of the interlayer insulating film 39a is exposed in the outer periphery of the opening 43.

Figure 5A:
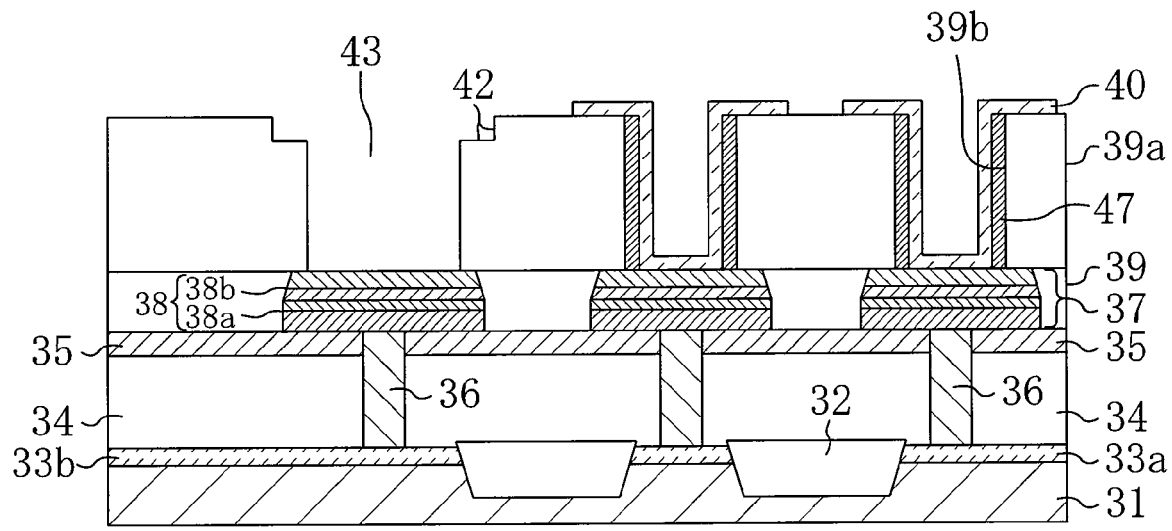
FIGS. 5A and 5B are cross-sectional views of a main part sequentially illustrating the manufacturing method of the semiconductor device according to the third example embodiment of the present invention.

As shown in FIG. 5A, the interlayer insulating film 39*a* is further etched so that the opening 43 formed in the interlayer insulating film 39*a* extends to the top surface of the upper plug 38. At this time, the top surface portion of the interlayer insulating film 39*a* which has been exposed in the outer periphery of the opening 43 is further etched to form a stepped portion 42.

Figure 5B:
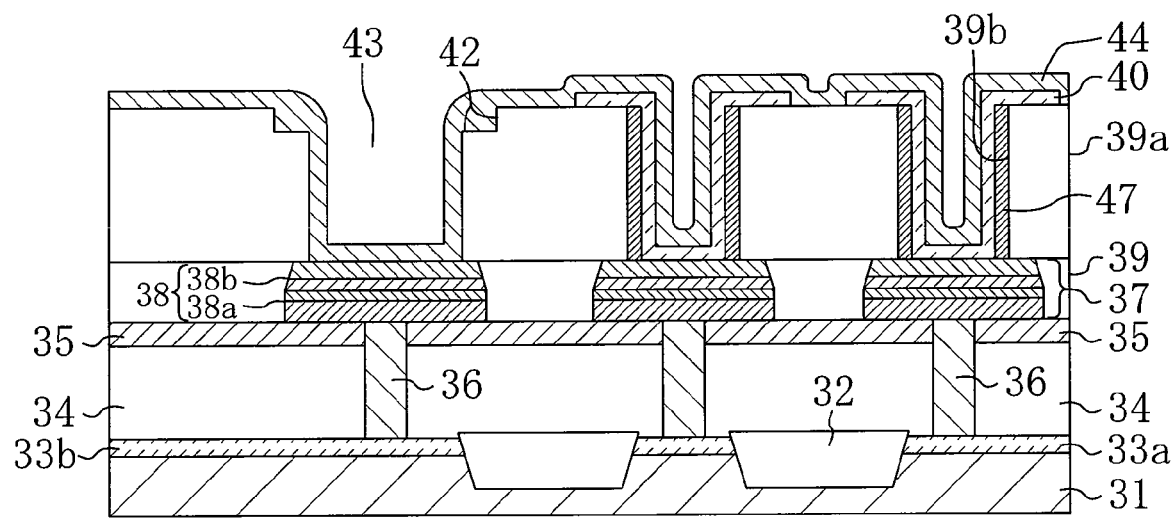
Figure 6A:
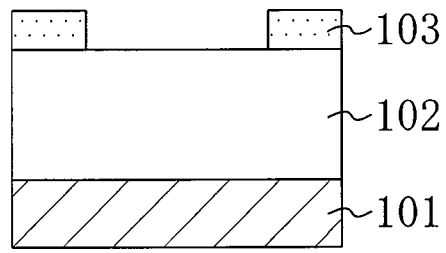
FIGS. 6A, 6B, 6C, 6D, and 6E are cross-sectional views of a main part sequentially illustrating a manufacturing method of a semiconductor device of related art.
Figure 6B:
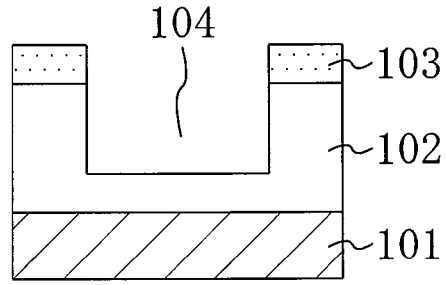
Figure 6C:
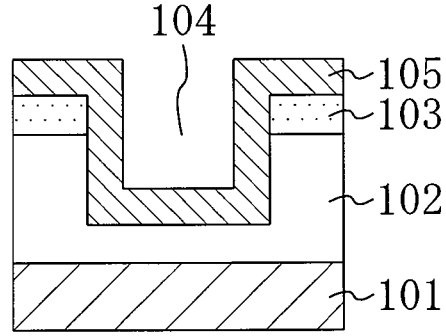
Figure 6D:
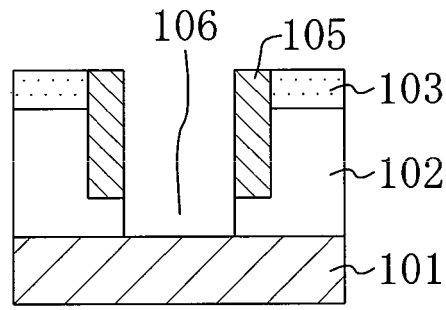
Figure 6E:
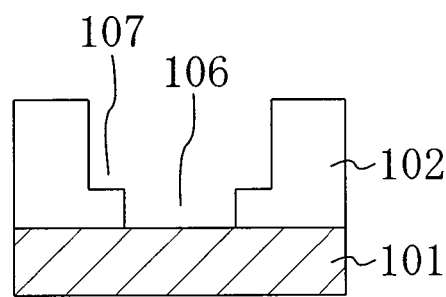

As shown in FIG. 5B, a conductive film (upper electrode) 44 is then formed on the ferroelectric film 40 and the interlayer insulating film 39*a* including the inside of the opening 43 having the stepped portion 42. At this time, excellent coverage of the conductive film 44 is implemented in the inside of the opening 43 because step coverage is reduced by the stepped portion 42. As a result, disconnections of the conductive film (upper electrode) 44 can be prevented from occurring due to thermal shrinkage in a later step. Note that the conductive film 44 can be made of a metal selected from the metal group consisting of platinum, iridium, and ruthenium, or a compound of a metal selected from this metal group. The conductive film (upper electrode) 44, the upper plug 38, and the lower plug 36 are thus connected to each other by this step.

As has been described above, the semiconductor device and the manufacturing method thereof according to each example embodiment of the present invention can prevent disconnections of a conductive film formed over a hole pattern of an insulating film, and are especially useful to form contact holes in a ferroelectric material.

What is claimed is:

1. A method for manufacturing a semiconductor device, comprising the steps of:
   (a) forming a first conductive film on a substrate;
   (b) forming an insulating film on the first conductive film;
   (c) forming on the insulating film a mask film having an opening exposing the insulating film;
   (d) anisotropically etching the insulating film exposed to the opening to form a recess in an upper part of the insulating film exposed to the opening and to cause a reaction product of a material of the insulating film and a material of an etching gas used for the anisotropic etching to adhere to a lower part of a sidewall portion of the mask film in the opening;
   (e) performing isotropic etching by using the reaction product as a mask to decrease the sidewall portion of the mask film in the opening in a horizontal direction to a main surface of the substrate, and performing anisotropic etching to etch the insulating film exposed at a bottom of the recess in a vertical direction to the main surface of the substrate while removing the reaction product adhering to the lower part of the sidewall portion of the mask film in the opening;
   (f) after the step (e), performing anisotropic etching by using the remaining mask film as a mask, thereby etching the insulating film present around the recess in the vertical direction to the main surface of the substrate to form a stepped portion in the insulating film, and also etching the insulating film exposed at the bottom of the recess to expose the first conductive film; and
   (g) after removing the remaining mask film, forming a second conductive film on the first conductive film exposed to the recess and on the insulating film.

2. The method according to claim 1, wherein a distance from an upper surface of the insulating film to a lower surface of the insulating film which forms the stepped portion is equal to a thickness of the second conductive film.

3. The method according to claim 1, wherein the steps (d), (e), and (f) are continuously performed under same etching conditions.

4. The method according to claim 3, wherein the etching conditions are such that an etching gas is an $Ar/CF_4$ or $Ar/Cl_2$ mixed gas, and an etching pressure in a chamber is controlled to 1.0 Pa to 2.0 Pa, and a bias of applied etching power is controlled to 150 W to 300 W.

5. The method according to claim 1, wherein the first conductive film and the second conductive film are made of a metal selected from a metal group consisting of platinum, iridium, and ruthenium, or a compound of a metal selected from the metal group.

6. The method according to claim 1, wherein the insulating film contains a ferroelectric material.

7. The method according to claim 6, wherein the ferroelectric material is SBT or PZT.

* * * * *